United States Patent [19]
Kühn

[11] 4,196,398
[45] Apr. 1, 1980

[54] REGULATION OF A PLURALITY OF SUPERCONDUCTING RESONATORS

[75] Inventor: Werner Kühn, Karlsruhe, Fed. Rep. of Germany

[73] Assignee: Gesellschaft für Kernforschung m.b.H., Karlsruhe, Fed. Rep. of Germany

[21] Appl. No.: 866,844

[22] Filed: Jan. 4, 1978

[30] Foreign Application Priority Data

Jan. 4, 1977 [DE] Fed. Rep. of Germany ....... 2700122

[51] Int. Cl.[2] ............................................. H03B 3/04

[52] U.S. Cl. .......................................... 331/9; 328/72; 331/11; 331/17; 331/25; 333/17 R

[58] Field of Search ..................................... 331/9-11, 331/17, 18, 25; 333/99 S, 17 R; 328/72, 233-238; 307/306

[56] References Cited

U.S. PATENT DOCUMENTS 3,146,398 8/1964 Schnädelbach ...................... 331/9 X
3,365,676 1/1968 Buss ...................................... 331/11

OTHER PUBLICATIONS

Despe et al., *Vibration-RF Control of Superconducting-Helix Resonators, etc.,* Conference, IEEE Trans. Nucl. Sci., Jun. 1973, vol. NS20, No. 3.

*Primary Examiner*—Paul L. Gensler
*Attorney, Agent, or Firm*—Spencer & Kaye

[57] ABSTRACT

In order to maintain a plurality of superconducting resonators, each having elastically deformable resonant structural elements, at the same natural frequency and phase position, each resonator is supplied with high frequency power independently of the other resonators forming part of the same system, the natural frequency of each resonator is set to a predetermined value by adjusting the amplitude of the power supplied, mechanical vibrations of the resonant structural elements are aperiodically suppressed by a velocity-dependent attenuation, and the resonator is returned to a predetermined high frequency operating vibration.

20 Claims, 9 Drawing Figures

TIME, t
x(t)
$\frac{dx}{dt}$
$K_1(x)_t$
$-\left(\frac{dx}{dt}\right)_t$
$-\left(\frac{dx}{dt}\right)_{t-t_1}$
$-\left(\frac{dx}{dt}\right)_{t+t_1}$
K(t)
MECHANICAL OSCILLATION AMPLITUDE, x, AND VELOCITY, $\frac{dx}{dt}$
OSCILLATION ATTENUATION FORCE COMPONENTS, K
TOTAL OSCILLATION ATTENUATION FORCE, K

REGULATION OF A PLURALITY OF SUPERCONDUCTING RESONATORS

BACKGROUND OF THE INVENTION

The present invention relates to a method and circuit for regulating a plurality of superconducting resonators to set all of them to the same predetermined natural frequency and phase position, the resonators being normally used having elastically deformable structural elements, e.g. helical resonators.

It is known that the quality factor Q of a superconducting resonator is $10^5$ to $10^{10}$ higher than that of a normally conducting resonator. This results in extremely narrow bandwidths, for example of the order of magnitude of one hertz for a 100 MHz resonator. The establishment and maintenance of frequency synchronism of a plurality of independent superconducting resonators thus requires highly precise, rapid frequency regulation. This requirement is particularly critical in the case of resonators which are inherently poorly stable mechanically, e.g. helical resonators having helices possessing a high degree of mechanical elasticity, which are used in large numbers in superconducting accelerators as accelerating resonators and which must be operated in frequency and phase synchronism.

It has already been proposed to solve this problem by coupling normally conducting short-circuit lines to the superconducting resonators and quickly changing their electrical length by cutting in or out so-called PIN diodes, the natural frequency of each resonator being influenced by the resulting change in its input impedance.

The drawbacks of such an approach are in particular that the strong HF currents in the normally conducting short-circuit lines produce high resistance losses which reduce the effective quality factor of the superconducting resonators by several orders of magnitude. This reduces the improvement realized from the use of superconductors with respect to savings in high frequency power.

In order to protect the PIN diodes which terminate the tuning lines, it is necessary to provide complicated external cooling systems employing liquid nitrogen.

The cooling of the short-circuit lines themselves is also very critical. For example, it is necessary that the temperature remain strictly constant since fluctuations in temperature produce changes in effective electrical length, which then lead to undesirable, uncontrollable frequency fluctuations.

The control range is very narrow so that the resonators often fall out of this range and the dependable control required for operation of the accelerator is not achieved. This is also true because automatic adjustment of a resonator, i.e. self-regulation, to the desired frequencies is impossible.

SUMMARY OF THE INVENTION

It is an object of the present invention to effect rapid, automatic setting and regulation of the resonant frequency of at least one controlled superconducting resonator having elastically deformable structural elements to a predetermined desired frequency which, when a plurality of controlled resonators are provided, is common to all resonators, and to provide resetting to the desired frequency without delay when there are frequency deviations as a result of external interference.

This and other objects are accomplished according to the present invention by supplying the at least one controlled resonator with high frequency power from a separate source independently of any other controlled resonators which are part of the same operating system, setting the natural, or resonant, frequency of the at least one resonator to a predetermined value by adjusting the amplitude of the high frequency power, aperiodically suppressing the mechanical vibrations of the resonator structural element by a speed dependent attenuation, and then returning the resonator to a predetermined operating high frequency oscillation. It has been found to be of particular advantage, in the practice of this method, for the fine tuning of the natural frequency to be effected by a rapid mechanical fine deformation of the elastically deformable resonator structural elements.

Each controlled resonator is thus fed with high frequency energy by its own individual feedback connected or VCO controlled transmitter, completely independently of the other resonators. Each resonator is thus always matched to its transmitter, independently of how large the deviation of its momentary natural frequency from the common operating frequency, or desired frequency.

Upon being switched on, or if there is a deviation of the natural frequency from the operating frequency due to interference, the HF transmitter quickly, and with permanent matching, pulls its resonator through the field amplitude range and thus through the frequency range to the common operating frequency value, at which value the frequency is locked in at once. The time sequence of this process is of the order of magnitude of milliseconds.

Frequency regulation thus occurs by way of a fine mechanical deformation of elastic structural elements in the resonator, in the helical resonator for example by finely deforming the helices. This deformation is realized by ponderomotive forces. Such forces, which by nature are electromagnetically generated, are proportional to the square of the magnetic and electrical field intensities in the resonator. Due to this quadratic dependency, these forces, and thus the fine deformation of the helices or of any other elastically deformable structural element can be regulated, to influence the resonant frequency quickly and with great sensitivity by acting on the HF amplitude of the resonator.

Thus, a significant advantage of the present invention is that the frequency control mechanism is located directly in the resonator and is based on utilization of the high frequency field which is already necessarily present there. This eliminates the need for additional loss-incurring stub lines, as well as sensitive coupling members and separately controlled electromagnetic auxiliary fields to regulate the frequency by mechanical fine deformation.

The advantages realized by the present invention are also particularly that the ponderomotive forces inevitably occurring in electromagnetic fields, which in known arrangements have a very disadvantageous effect on the operating behavior and on the operating dependability, can be utilized in a directed manner to produce rapid frequency regulation.

Another substantial advantage results from the suppression of mechanical fluctuations in the resonator with these ponderomotive forces. In known devices of the type to which the present invention relates, the mechanical oscillations which modulate the high frequency resonant vibrations cannot be eliminated. The resulting wide frequency rise of the HF oscillations over several kilohertz must be regulated out by means of short-circuit lines and PIN diodes coupled to the resonator. The high currents then flowing in the normally conducting short-circuit lines produce correspondingly high losses which lead to amplitude fluctuations and thus to frequency shifts which are difficult to control and which themselves again require a highly sensitive arrangement to keep the amplitude constant. Thus a considerable quantity of sensitive electronic devices is made superfluous by the ponderomotive suppression of mechanical resonator oscillations according to the present invention.

DESCRIPTION OF THE PREFERRED EMBODIMENTS

In an elastically deformable high frequency resonator, the resonant frequency depends on the field intensity in the region occupied by the resonator. Thus there exists, for example, in resonators made of niobium helices a strong quadratic dependence of $\Delta f \approx E^2$, where E is the electromagnetic field intensity, which can be reproduced also in the superconductive state. With resonant frequencies of about 100 MHz and strong fields in the region of the limits of attainable field intensities, the frequency shift lies in the order of magnitude of several hundred kHz. By regulating the field amplitude, it is thus possible to control the resonant frequency of a helical resonator.

Electromagnetic forces deform elastic resonators in dependence on the electromagnetic field intensity. Thus, the following relationship defines the shifts of the resonant frequency upon small deformations, for the field intensities encountered by helices in practice:

$$E = \left(\frac{f_0 - f}{G}\right)^{\frac{1}{2}}$$

where $f_0$=frequency at $E \rightarrow 0$ f=frequency at the particular value of E, and G=geometry factor.

Figure 1:
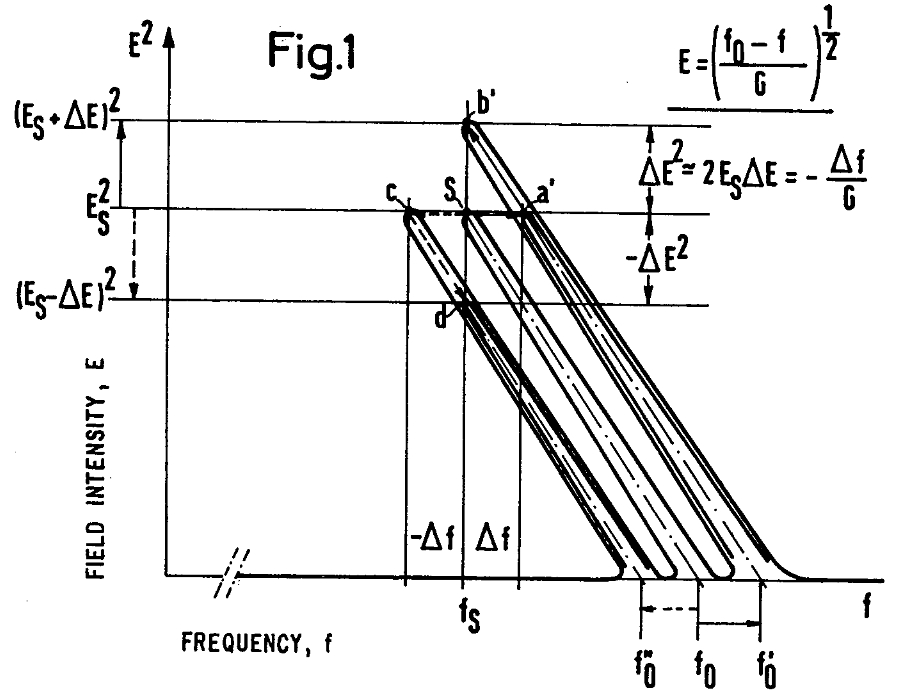
FIG. 1 is a diagram illustrating the relation between field intensity and the natural frequency of a helical resonator.

This relationship is shown in FIG. 1 which shows $E^2$ as a function of frequency (f), and thus illustrates the dynamics of variations in the natural frequency of a helical resonator. $f_0$ is the natural frequency of the resonator when it is not subject to mechanical interference and the field intensity E approaches, or goes to, 0. With increasing field intensity, and the resulting mechanical deformation, the natural frequency decreases. The operating point S is determined in this case by the desired frequency value $f_s$ and the desired field intensity value $E_s$.

If there now occurs a forced deformation of the resonator as a result of an external interference, so that the zero field intensity frequency $f_0$ shifts toward $f'_0$, then the entire resonance curve will experience a shift to the right. Since, assuming the resonator has no losses, the stored energy remains practically constant, the resonant frequency shifts along the horizontal $E_s^2$ line from the operating frequency $f_s$ to the right by $\Delta f$ to point a'. If the field intensity is now increased, the desired frequency $f_s$ is restored after passage of the operating characteristic through the interval $\Delta E^2 \approx 2E_s\,\Delta E$ from a' to b'.

A forced deformation in the opposite direction shifts the zero field frequency from $f_0$ to $f''_0$, and thus shifts the resonance curve to the left. The resonant frequency therefore moves on the horizontal $E_s^2$ line from S to c, and by then reducing the field intensity by $-\Delta E^2$, the resonant frequency goes back from c to d, to the desired frequency $f_s$.

Figure 2:
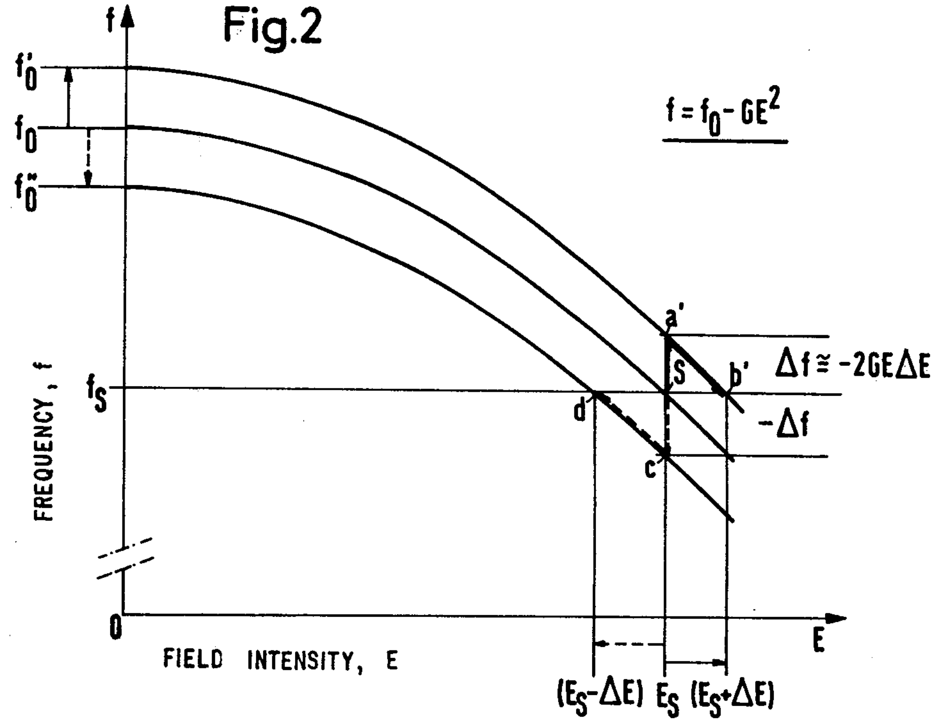
FIG. 2 is a diagram illustrating the regulation of the natural frequency of such a resonator as a function of the field intensity.

In the f(E) diagram of FIG. 2 the regulating mechanism becomes even clearer since the relationship $\Delta f/\Delta E$ can be read off directly. The externally excited frequency jumps from the $f_0$ parabola to the $f'_0$ and $f''_0$ parabolas can be compensated by the field intensity changes $\Delta E$ and $-\Delta E$, respectively. The desired frequency $f_s$ is reached again by shifting over the paths S, a', b', or S, c, d, respectively.

Due to the quadratic dependency of the frequency on the field intensity, $\Delta f$ which approximately equals $-2GE\Delta E$ is dependent on the field intensity. At high field intensities, small variations in the field can thus be used to tune out large changes in frequency. For statistical frequency shifts of the order of magnitude of 100 kHz over the field intensity range from $0 \leqq E \leqq E_s$, and frequency fluctuations due to external interferences of a few kHz, the influence of the frequency regulation by field intensity variation on the desired field level is insignificant, particularly because the quadratic dependence $$f = f_0 - GE^2$$

exists. A reduction in frequency is effected by rapidly charging the resonator from a strong, feedback coupled transmitter and an increase in frequency is realized by strong attenuation of the resonator.

Figure 3:
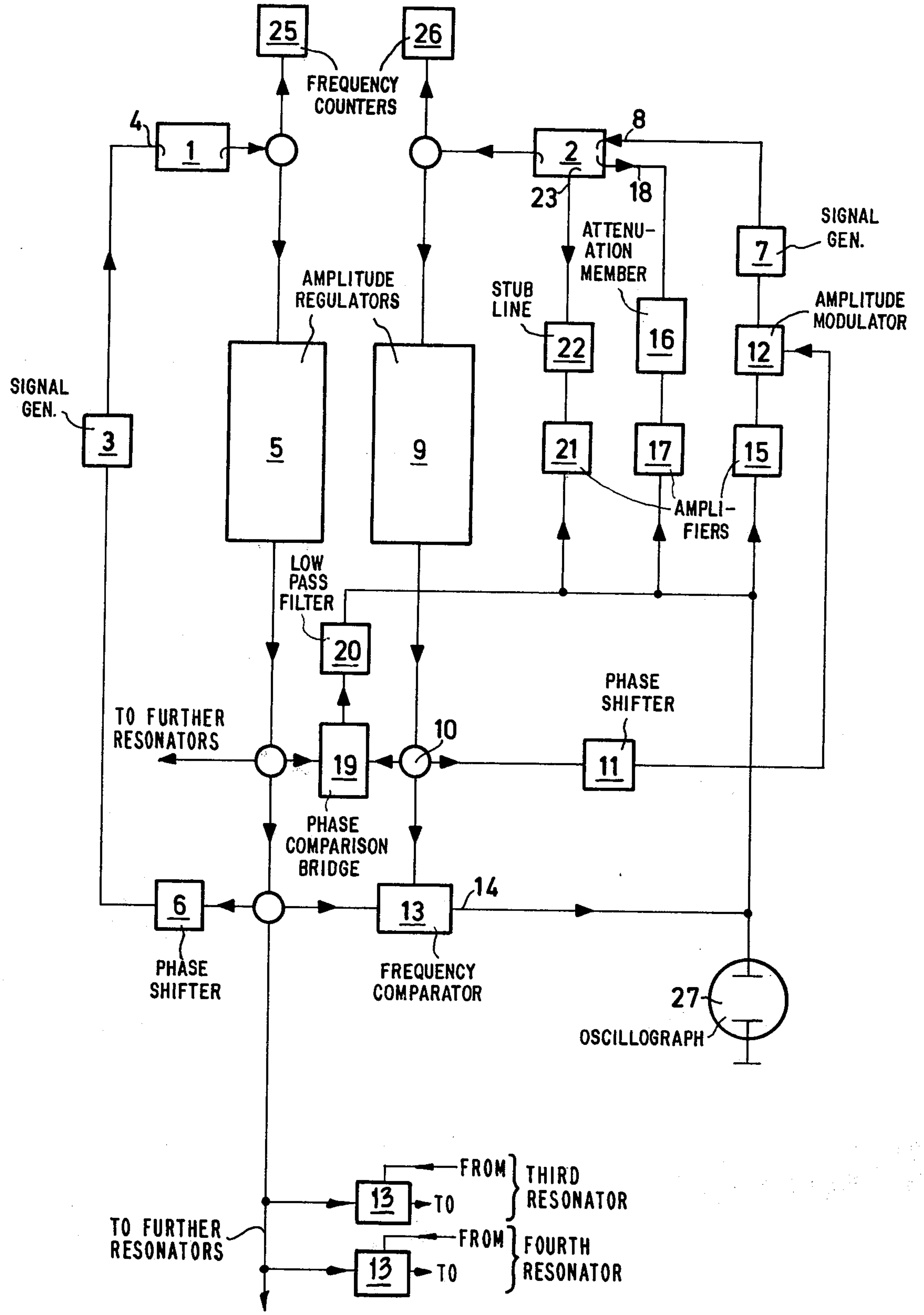
FIG. 3 is a block circuit diagram of a regulating circuit according to the invention for operating a plurality of helical resonators at the same frequency.

FIG. 3 shows the basic structure of the regulating device according to the invention in the form of a block circuit diagram of a regulating circuit for a plurality of helical resonators with identical operating frequencies.

Two resonators 1 and 2 of a device for accelerating particles employing superconducting helical resonators and their supply circuits are shown in a simplified manner. The supply circuit for resonator 1 essentially consists of a feedback-coupled controllable HF signal generator 3 which is connected, via a coupling device 4, with resonator 1 and in whose feedback branch there is provided an amplitude regulator 5 for keeping the field amplitude constant and a phase shifter 6.

The supply circuit for resonator 2 is similar in principle. A controllable HF signal generator 7 feeds resonator 2 via a strong coupling device 8. The coupled-through signal travels via an amplitude regulator 9 for keeping the field amplitude constant, an HF signal distributor 10, a phase shifter 11 and an amplitude modulator 12 back to the HF transmitter 7. Frequency comparison between resonator 1 and resonator 2 is effected in a frequency comparator 13 which produces at its output 14 a rectified voltage representative of the difference frequency, i.e. the + deviation. The output 14 of the frequency comparator 13 is supplied, via a d.c. amplifier 15 which amplifies only voltages having a predetermined first polarity, to the amplitude modulator 12 of the resonator 2.

Resonator 1 operates at a frequency $f_1$ and constitutes a reference frequency, or clock frequency, source for the other resonators. Resonator 2 thus constitutes a controlled resonator that operates at a frequency $f_2$ which is to be maintained in synchronism with $f_1$.

Frequency synchronism $f_1=f_2$ is attained starting from an operating state $f_2>f_1$, in that the amplitude modulator 12 under control of the output voltage from frequency comparator 13 releases the full power of the HF generator 7 so that there will be a rapid increase in field intensity in resonator 2 and thus, referring to FIG. 2, a rapid reduction of the value of frequency $f_2$. When frequency coincidence has been reached between the clock pulse generating resonator 1 and the follow-up resonator 2, i.e. when $f_1=f_2$, the HF transmitter 7 is choked by the output signal from amplitude modulator 12 to the power requirement for steady state operation.

In order to be able to attain frequency synchronism $f_1=f_2$ starting from $f_2<f_1$, an attenuation member 16 is connected in parallel with the series connection of the amplitude modulator 12 and the HF generator 7, the attenuation member being controlled by the rectified voltage output 14 of frequency comparator 13 via a second direct voltage amplifier 17 which amplifies only voltages which have a second polarity opposite to the first polarity. Resonator 2 is heavily attenuated by the attenuation member 16, which is coupled in via a second coupling device 18 so that, referring again to FIG. 2, there occurs a rapid reduction of the field intensity in resonator 2 which causes frequency $f_2$ to be increased until equalization of $f_2=f_1$ has been attained, whereupon the attenuation controlled by the output signal from frequency comparator 13 is terminated.

The attenuation member 16 may, for example, consist of a strongly coupled, short-circuited coaxial line. Connected in the area of maximal electrical field of this coaxial line, the member may contain among other suitable arrangements, a triode whose grid is controlled by the signal at the output of the second direct voltage amplifier 17. With a frequency $f_2<f_1$ this triode constitutes a termination at the characteristic impedance of the resonator and with $f_2>f_1$ the triode presents a high resistance and is thus without effect.

Instead of the triode, it may also be possible to use, for example, an arrangement including a switching diode and a series resistance having the value of the characteristic impedance.

It is of course also possible to couple the HF generator 7 and the attenuation member 16 to the resonator 2 via a common coupling device, for example, a superconducting coupling loop.

The strong charging of the follow-up resonator 2 at frequencies $f_2>f_1$ from amplitude modulator 12 on the one hand and the strong attenuation at frequencies $f_2<f_1$ by attenuation member 16 on the other hand keeps the resonator 2 at the frequency of the master frequency generating resonator 1.

This amplitude control is very fast since the control of the resonator 2 by means of the HF generator 7, which is constructed as a power transmitter, and by the optimum attenuation member 16, is effected via strong couplings. This produces time constants which are small compared to the periods of the mechanical oscillations of the helices or generally of the elastically deformable resonator components. This directed control of the ponderomotive forces makes possible the required mechanical fine deformation of the helices.

In the circuit arrangement of FIG. 3, this deformation acts as a feedback counteracting parasitic oscillations of the helices. Contraction of the helices leading to a frequency $f_2<f_1$ is stopped due to the immediately fully effective high frequency attenuation of the helices. Expansion of the helices with the resulting $f_2>f_1$ is counteracted by the immediately fully switched in additional ponderomotive forces. This is therefore not an analog amplitude type of control based on a linear or, quite generally speaking, a constant function of the deviation from the desired frequency, but a digital effect, i.e. the amplitude is influenced according to a jump function. Breaking out of the regulation is prevented by the feedback connected HF generator 7 whose output always follows movements of the helices of resonator 2 and pulls them into the frequency of the helices of resonator 1.

In further accordance with the invention the regulating properties can be improved by the use of a phase comparison bridge 19 which is connected between the feedback branches of the first resonator 1 acting as master frequency generator and the follow-up second resonator 2 so as to effect phase control.

Via a lowpass filter 20 and an amplifier 21, the phase comparison bridge 19 controls the input reactance of a stub line 22 which is coupled to the resonator 2 via a third coupling device 23. The reactance of the stub line 22 may be varied, for example, in a known manner with PIN diodes. The lowpass filter 20 is provided to prevent the phase regulation from beginning before $f_2$ and $f_1$ coincide.

The signal from the phase comparison bridge 19 not only controls the stub line 22 but also the amplitude modulator 12 and the attenuation member 16. The rectified voltage from the frequency comparator 13 in the case of a frequency deviation, and from the phase comparison bridge 19, when a phase deviation occurs, are decoupled by lowpass filter 20. This assures that the resonant frequency $f_2$ is held, except for a minimal correction for phase synchronism, by amplitude modulator 12 and attenuation member 16 by means of the amplitude at the master frequency $f_1$. Thus only very low reactance power needs to be switched at the stub line 22 and a complicated, heavily attenuating multiple point setting member is eliminated.

Locking of the frequencies against any frequency deviations is assured by HF generator 7 and attenuation member 16. The stub line 22 comes into use only in special cases, for finely adjusting the phase within the stability range of the particles to be accelerated. For this a low coupling factor and small dimensions of the stub line 22 and of the coupling device 23 are sufficient.

The frequencies are monitored by means of frequency counters 25 and 26 and an oscillograph 27 monitors magnitude and time sequence of frequency deviations during the adjustment of the circuit and during possible malfunctions.

The resonator 1 which is operated as a clock pulse source can of course also be replaced by a frequency stable master oscillator, or a reference frequency source. The inputs to frequency comparator 13 and the phase comparison bridge 19 then provide a frequency control for fixed frequency operation which can be applied to any desired number of connected resonators to be stabilized, as indicated in FIG. 3 with respect to third and fourth resonators each having an associated frequency comparator 13 and, if desired, a phase comparator 19 (not shown).

In the circuit arrangement of FIG. 3, the correction value becomes immediately fully effective at the slightest change in the desired frequency $f_1$ i.e. at the slightest displacement from the "desired geometry" of the helices. This prevents the helices from breaking out of the desired frequency value. If a helix is, however, undergoing strong mechanical oscillations, which may be excited by mechanical impacts on the cryostat, by vibrations of the ground, etc., then the correction effect which is directed oppositely to the instantaneously occurring deflection continues to act with full magnitude until the zero error position has been passed and thus has an accelerating effect on the moving masses of the helix. This behavior is shown in the curves of FIGS. **4*a*, 4*b* and 4*c***, showing time functions of displacement (x(t)) and velocity of a helix.

The movement of a point on a helix follows, for example, the curve x(t) shown in FIG. **4*a*. As a result of this movement, the amplitude modulator 12 and the attenuation member 16 (see FIG. 3) establish the compensation force $K_1(x)_t$ having the rectangular waveform shown in FIG. 4*b***. In order to increase the stability of the system the damaging acceleration forces acting before the zero passages can be compensated or overcompensated by a velocity dependent regulating force.

For this purpose, the displacement curve x(t) is differentiated with respect to time, the result being shown in FIG. **4*a*. The inverse of the time derivative curve then furnishes the control function $-(dx/dt)_t$ shown in FIG. 4*b*** for the velocity dependent compensation force $K_2(v)$. The sum of the velocity-dependent compensation force and the displacement-dependent compensation force then furnishes the total compensating force K acting on the helix, having the form:

$$K = aK_1(x) + bK_2(v), \text{ or if } K_2 = -\frac{dx}{dt} \quad (1)$$

$$K = aK_1(x) - b\frac{dx}{dt} \quad (2)$$

The factors a and b are parameters with which the amplitudes of the square wave voltage and of the time derivative function, and thus of the two force components, can be set.

Figures 4A, 4B, 4C:
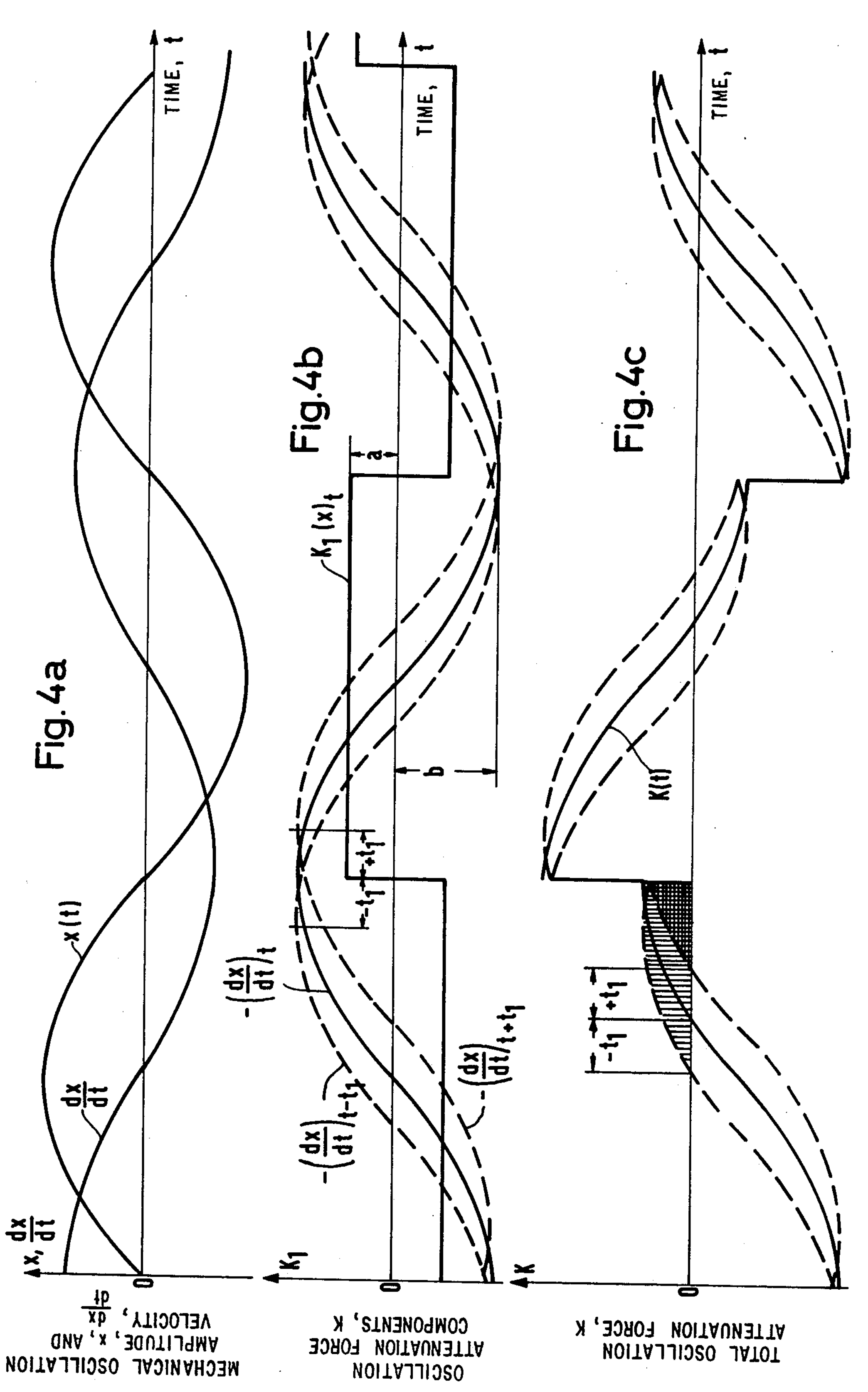
FIGS. 4*a*, 4*b* and 4*c* are diagrams illustrating the dynamic attenuation of mechanical oscillations in a regulating process according to the invention.

If it is assumed that the helix oscillates harmonically such that $x(t)=x_0 \sin \omega t$, then the waveform shown in FIG. **4*c* results for the resulting correction force K. At the point of intersection of this K(t) curve with the zero deflection line, which is clearly before the zero passage of the x(t) curve, of FIG. 4*a*, a dynamic compensating force opposing deflections in the −x direction begins so that the moving masses of the helix are braked before they reach the desired position, i.e. before they reach the geometric operating point, or zero deflection position. If the operating point is passed, the compensating force immediately jumps to the sum maximum value. The influences of the parameter a on the part $K_1(x)$ of the compensating force which is constant during each half period and of parameter b on the velocity dependent part $K_2(v)$ are shown in FIG. 4*b***.

The braking pulse can be strongly influenced by the dynamic counterforce $K_1(x)_t$ by a shift in time of the derivative function by the interval t as shown by the broken line K(t) curves in FIG. **4*c***. The dynamic compensating force is represented by the vertically hatched area for a shift by $-t_1$ and by the horizontally hatched area for a shift by $+t$, respectively. Parameters a, b and $t_1$ can be used to substantially adjust the function $$K = aK_1(x)_t - b\left(\frac{dx}{dt}\right)_{t+t1} \quad (3)$$

to the existing conditions such as: the mechanical natural frequency of the helix, interfering frequency spectrum, nonlinearities in the electronic system, delay effects, etc.

An optimum setting of the parameters a, b, $t_1$ is achieved when, under the given conditions the helix behaves aperiodically. Under this condition, instabilities, and particularly the excitation of parasitic oscillations are made impossible.

Figure 5:
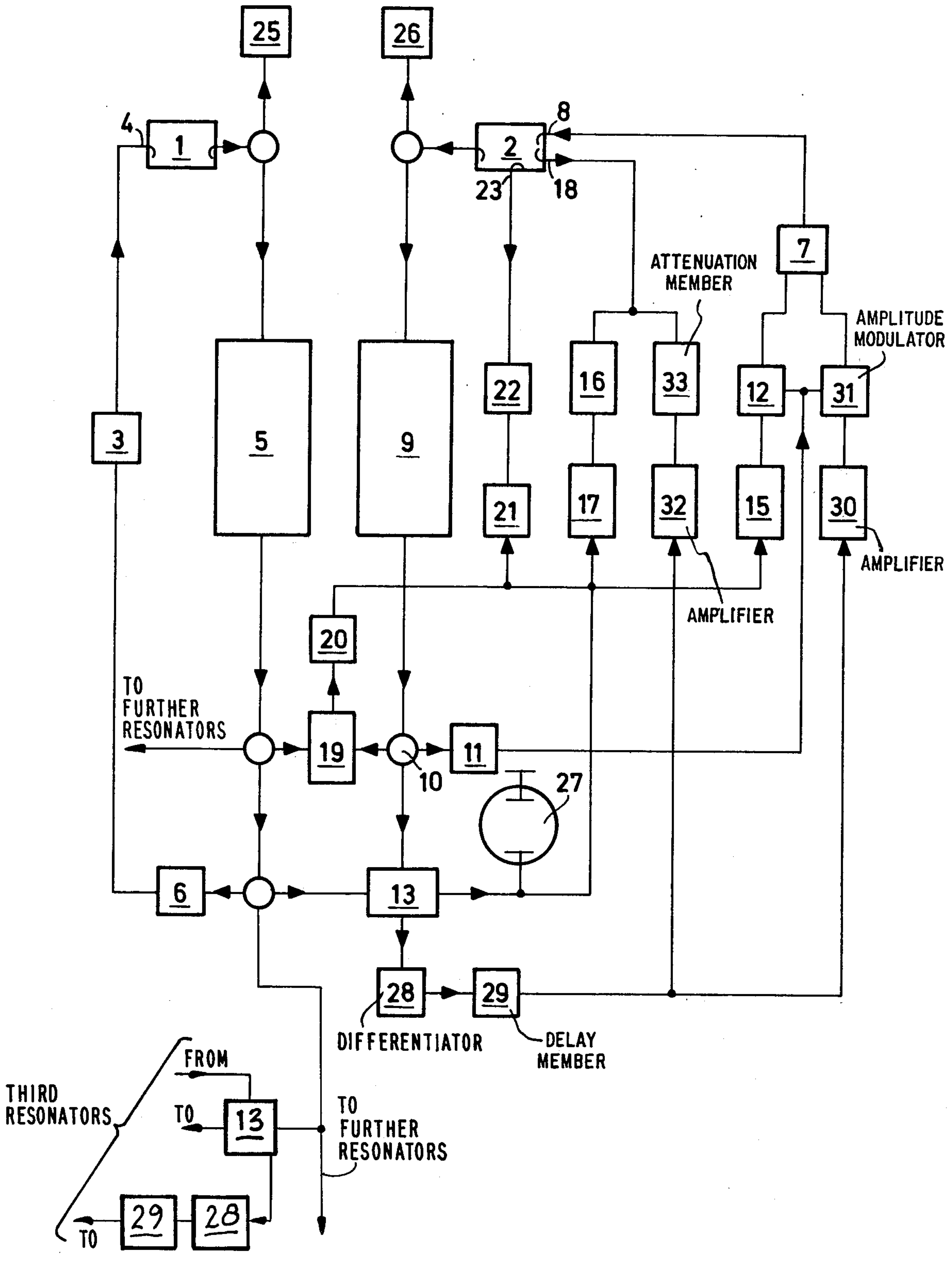
FIG. 5 is a block circuit diagram of a regulating circuit according to the invention providing velocity dependent attenuation of mechanical oscillations.

FIG. 5 shows a block circuit diagram of a regulating circuit with speed dependent attenuation of the helix oscillations. Components 1 to 27 correspond to structure and operation to the identically designated elements of FIG. 3. The velocity-dependent compensation signal −dx/dt, whose form is shown in FIG. **4*b*, is generated by means of a time differentiating member 28 which is connected in series to an output of frequency comparator 13. A delay member 29 which is connected in series with the differentiating member 28 permits setting of the time shift $t_1$ for $-(dx/dt)_{t+t1}$, also shown in FIG. 4*b***.

The output signal of the delay member 29 is brought, via a direct voltage amplifier 30, which amplifies only a voltage having a predetermined first polarity to an amplitude modulator 31 which controls the HF generator 7 together with, and in the same manner as, the amplitude modulator 12.

The output signal of delay member 29 is also delivered, via a direct voltage amplifier 32 which amplifies only voltages having the polarity opposite to the predetermined first polarity, to an attenuation member 33. With these two channels, the dynamic compensating force $bK_2 = -b(dx/dt)_{t+t1}$ is supplied to resonator 2 (see FIGS **4*b*, 4*c* and equations (1) and (3)). In resonator 2 the forces $bK_2$ and $aK_1$, the latter being coupled in through the channels 15, 12, 7 and 17, 16 already described in connection with FIG. 3**, are superimposed to form the resulting force K(t).

The amplification factors of the square wave, or limiting amplifiers 15 and 17, which are controlled by the output from frequency comparator 13 are set according to the desired value of parameter a and the amplification factors of the linear amplifiers 32 and 30 controlled by differentiating member 28 are set according to the desired value of parameter b. The parameters a and b and the time shift $t_1$ then produce the curve for the resulting electromagnetic correction force K(t) which acts in resonator 2 and is shown in FIG. **4*c***.

In practice, the feeding and regulation of resonator 2 does not require three coupling loops. The high frequency art offers a plurality of suitable switching elements with which the outputs of the HF transmitter 7, attenuation members 16 and 33 and the stub line 22 can be mixed outside of the resonator without unduly increasing the costs of cryogenic cooling.

Connections to a third resonator are also illustrated.

Figure 6:
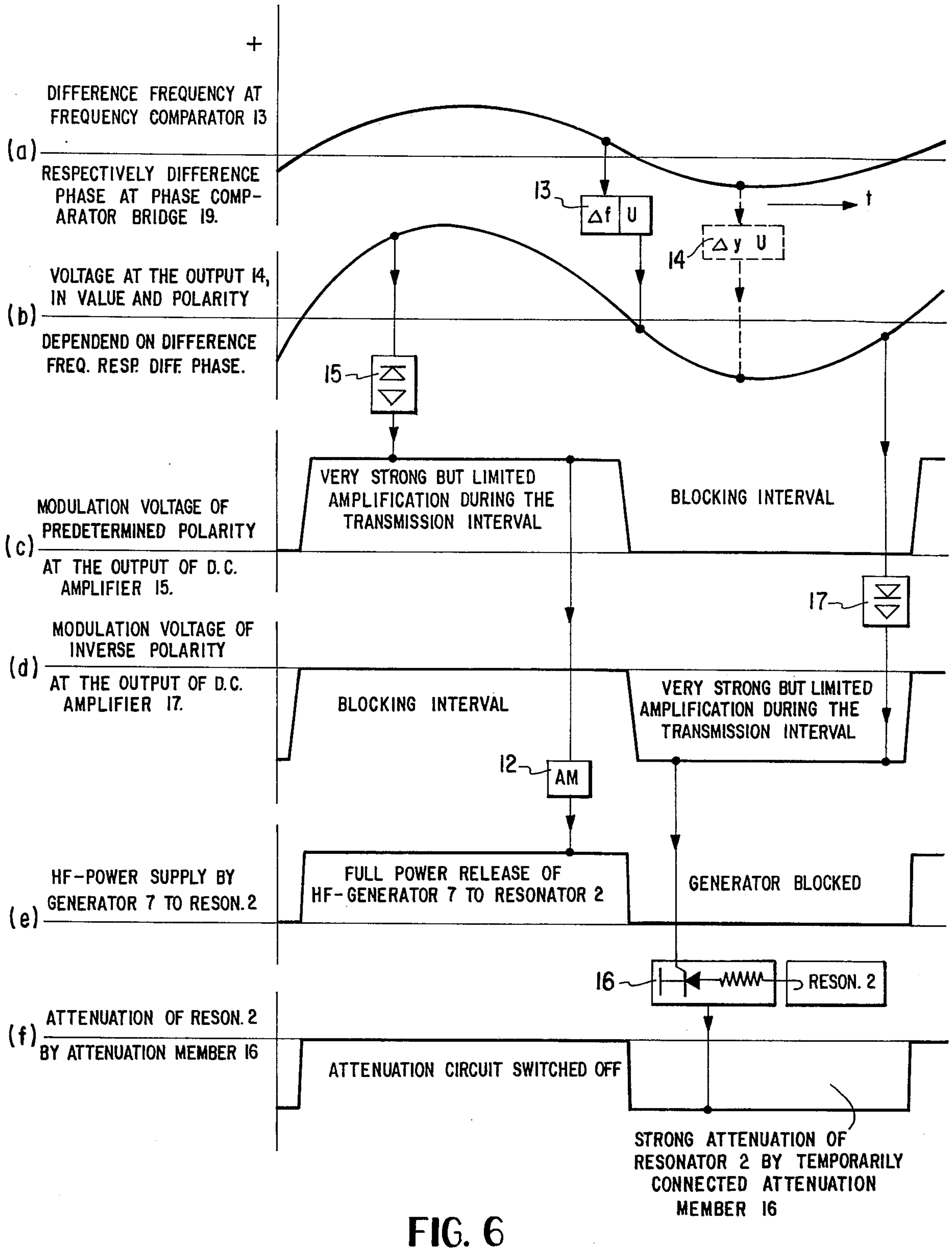
FIG. 6 is a schematic diagram of the amplitude control circuit for resonator 2 as a function of frequency—or phase—deviations respectively to suppress frequency differences in the resonators.

A schematic diagram of the amplitude control in resonator 2 as a function of the deviation of frequency or of phase respectively between the resonators 1 and 2 is shown in FIG. 6. The difference frequency with an assumed characteristic (a) effects the frequency comparator 13. The voltage (b) at the output 14 corresponds to the value and polarity of the difference frequency (a). Voltage (b) is connected to the inputs of the d.c. amplifiers 15 and 17, which are only sensitive to the first and second polarity respectively. They produce a voltage of rectangular shape by a very strong amplification with opposite polarity (c) and (d). The amplitude modulator 12 which follows the d.c. amplifiers 15 transmits the voltage (c) amplified to the generator 7 which releases now full HF-power to resonator 2 as shown in (e). The attenuation member 16 connected to the d.c. amplifier 17 is switched to the resonator 2 by the rectangular voltage (d). The time dependence of the full power supply and the strong attenuation of resonator 2 is presented in (e) and (f). The devices 12, 13, 15, 16 and 17 are well-known electronic units.

Figure 7:
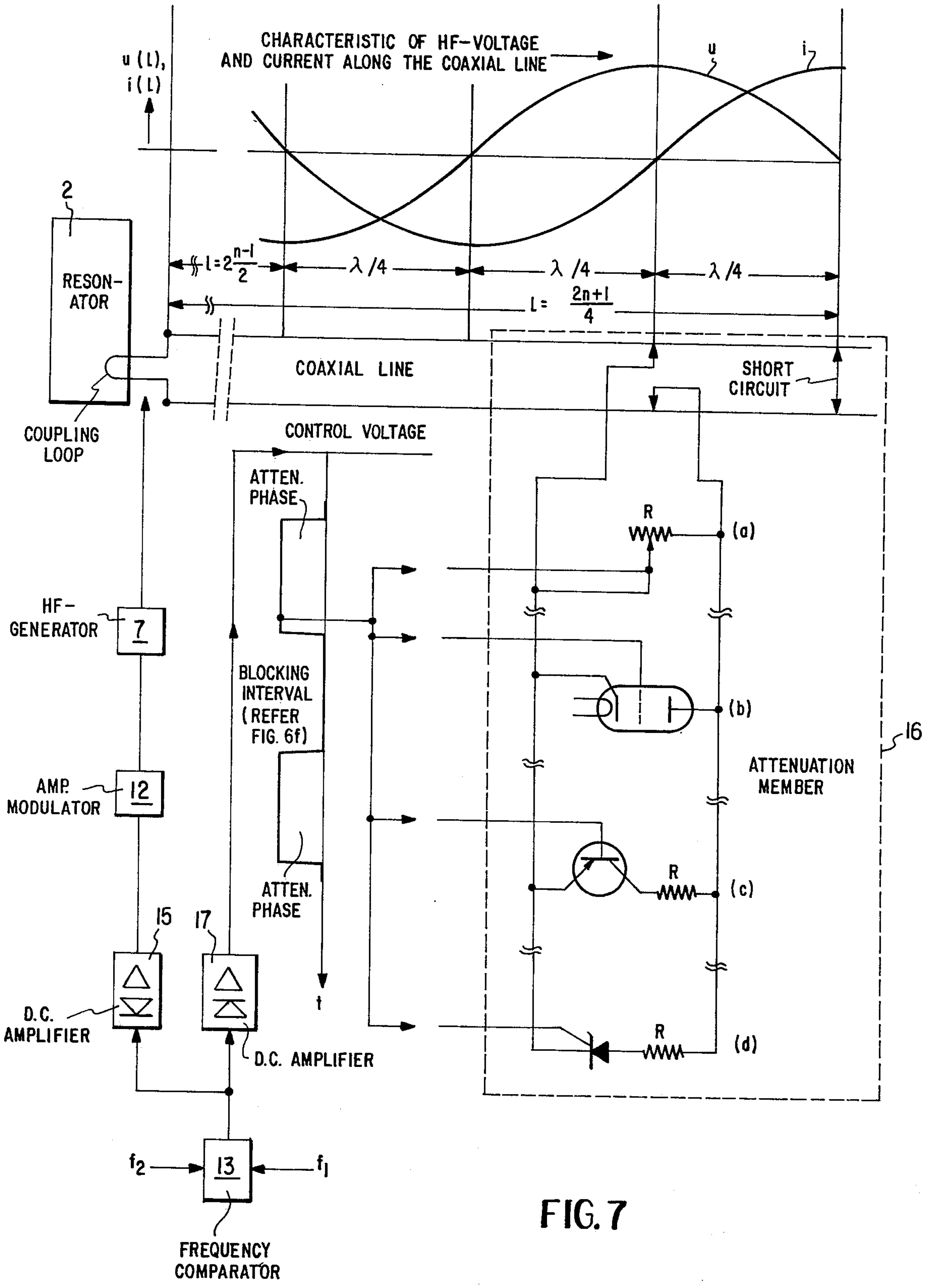
FIG. 7 is a trunking schema of the attenuation circuit with different possibilities in using electronic elements.

A trunking scheme of the attenuation circuit is shown in FIG. 7. The upper part of the drawing demonstrates the characteristic of HF-voltage and current along a short circuited coxial line being supplied by a HF-generator. In the present case, the coupling loop of the resonator 2 acts as the HF-generator. According to the laws of high-frequency wave propagation the input resistance of a short circuited coaxial line with the length $1=\lambda/4$ is infinite. Such a $\lambda/4$-line, or in general, a short circuited line with the length to a resonator does not influence the resonator which is coupled if it is assumed, that this $$1 = \lambda\frac{2n+1}{4};$$

n=0,1,2 line is an ideal line without losses. In other words, a stub line with this property does not disturb the resonator, in practice, it does not exist concerning the function of the resonator. This situation will be rigorously changed if a load is connected to the coaxial line especially at the points of voltage maximum. A more or less attenuation of the resonator then will be attained. This effect is used in the attenuation circuit. Hereinafter different suitable electronic elements will be connected to the voltage maximum point and controlled by the rectified voltage of d.c. amplifier 17 as shown in FIG. 6 and FIG. 7. Suitable controllable elements are for example electronic tubes, transistors, pin diodes, etc. In FIG. 7(*a*) the principle of attenuation is demonstrated by a controllable resistor. Such a resistor can be realised by a electronic tube according to FIG. 7(*b*) with a range from zero to infinite. In FIG. 7(*c*) a resistor is coupled to the line by a transistor and in FIG. 7(*d*) a special switching diode, known as pin diode, connects a resistor R during the attenuation phase to the line. If R corresponds to the characteristic impedance Z of the coaxial line, no reflection takes place and all HF-power coupled out of the resonator will be absorbed at the attenuation circuit and the resonator will be strongly attenuated.

It will be understood that the above description of the present invention is susceptible to various modifications, changes and adaptations, and the same are intended to be comprehended within the meaning and range of equivalents of the appended claims.

What is claimed is:

1. Method for controlling the operation of at least one controlled superconducting resonator forming part of a single operating system, the resonator having elastically deformable structural elements, deformation of which alters the resonator frequency, to cause the at least one resonator to operate in frequency and phase synchronism with a reference frequency, comprising: supplying the at least one resonator with high frequency power independently of any other resonators which are part of the same operating system; setting the natural frequency of the at least one resonator to a predetermined value by adjusting the amplitude of the high frequency power, and aperiodically suppressing mechanical vibrations of the resonator structural elements by imposing an attenuation on such oscillations which is dependent on the oscillation velocity and then returning the frequency of the at least one controlled resonator to the predetermined natural frequency value.

2. Method as defined in claim 1 wherein said step of setting is carried out by effecting a rapid mechanical fine deformation of the structure elements of the at least one resonator.

3. Method as defined in claim 2 wherein the mechanical fine deformation of the resonator structural elements is effected by producing at the resonator electromagnetic ponderomotive field forces which are proportional to the square of the field intensity and are independent of the resonator frequency.

4. Method as defined in claim 1 wherein the mechanical oscillations of the structural elements of the at least one resonator act as interfering oscillations and the high frequency power is tightly coupled to the at least one resonator for causing the velocity-dependent attenuation of the oscillations in that resonator to be effected with time constants which are small compared to the periods of the mechanical natural oscillations.

5. Method as defined in claim 1 wherein a tight coupling exists between the at least one resonator and its source of high frequency power, and the power of the high frequency source is small compared to the power required to feed a normally conducting resonator but large compared to the power loss of a superconducting resonator, whereby by means of said tight coupling the building up of operating field intensity in the resonator is effected with a very short time delay in the order of magnitude of milliseconds.

6. Method as defined in claim 1 wherein the operation of imposing a velocity-dependent attenuation during said step of suppressing is carried out by applying an attenuation force which varies as a function of the oscillation velocity but is shifted in time with respect thereto by a time interval which is small compared to the periods of the mechanical oscillations.

7. A circuit for controlling the operation of at least one frequency controlled superconducting resonator forming part of a single operating system and having elastically deformable structural elements, deformation of which alters the resonator frequency, to cause the at least one resonator to operate at the same predetermined natural frequency as, and in phase synchronism with, the signal from a reference resonator operating as a reference source, the at least one frequency controlled resonator being operated to follow the operation of the reference resonator, comprising: an individual power supply circuit for the controlled resonator, said supply circuit being composed of a high frequency power generator connected to supply power to its associated resonator, and a feedback branch, said feedback branch containing means for maintaining the power amplitude constant and phase shifting means; and an individual control circuit associated with the controlled resonator and including a frequency comparator connected to compare the operating frequencies of the reference resonator and the resonator and producing an output signal representative of the difference between those frequencies, and an amplitude modulator connected in said feedback branch associated with the controlled resonator and connected to be controlled by the output signal from said frequency comparator in order to vary the high frequency power supplied to the controlled resonator in a direction to reduce the difference between the operating frequencies of the reference resonator and the controlled resonator.

8. An arrangement as defined in claim 7 wherein the polarity of the output signal produced by said frequency comparator corresponds to the direction in which the frequency of the controlled resonator differs from that of the reference resonator, and said control circuit further comprises first polarity selecting means connected between said frequency comparator and said amplitude modulator for causing said amplitude modulator to be controlled only by comparator output signal values having a predetermined first polarity.

9. An arrangement as defined in claim 8 wherein said control circuit further comprises: a controllable attenuation member connected to attenuate the power delivered to the controlled resonator; and second polarity selecting means connected between said frequency comparator and said attenuation member for causing the attenuation produced by said attenuation member to be controlled only by comparator output signal values having the polarity opposite to the predetermined first polarity.

10. An arrangement as defined in claim 9 wherein: said attenuation member comprises a short-circuited coaxial line and a controllable member connected to said line at a voltage maximum point thereof for setting the resistance of said line to a predetermined value; and said control circuit further comprises a first coupling device tightly coupling the controlled resonator to the output of its respective power generator, and a second coupling device tightly coupling the controlled resonator to said attenuation member.

11. An arrangement as defined in claim 10 wherein said controllable member comprises a triode whose grid is controlled by the signal provided by said second polarity selecting means.

12. An arrangement as defined in claim 10 wherein said controllable member comprises a switching diode and a series resistance having a resistance value equal to the characteristic impedance of the second resonator, and said switching diode is controlled by the signal provided by said second polarity selecting means.

13. An arrangement as defined in claim 10 wherein each said coupling device is made superconducting.

14. An arrangement as defined in claim 12 wherein each said coupling device comprises a superconducting coupling loop.

15. An arrangement as defined in claim 9 wherein said control circuit further comprises a common coupling device coupling said power generator associated with the controlled resonator and said attenuation member to the controlled resonator.

16. An arrangement as defined in claim 9 wherein said control circuit further comprises: phase comparison means connected for providing an output signal representative of difference in phase between the oscillations of the reference resonator and controlled resonator; a stub line coupled to the controlled resonator; and a low pass filter and amplifier connected between said phase comparison means and said stub line for varying the reactance presented to the controlled resonator by said stub line as a function of the output signal provided by said phase comparison means.

17. An arrangement as defined in claim 16 wherein said low pass filter is connected to said first and second polarity selecting means for supplying thereto output signals from said phase comparison means.

18. An arrangement as defined in claim 7 wherein the elastically deformable structural elements of the controlled resonator may experience mechanical oscillations, and said control circuit further comprises means for providing forces whose value is dependend on the velocity of movement of the structural elements and which act to attenuate such mechanical oscillations, said force providing means comprising: a time differentiating member connected to receive a signal from said frequency comparator and producing an output signal proportional in amplitude to the velocity of movement of the structural elements, and having a polarity representative of the direction of movement of the structural elements; time delay means connected to the output of said differentiating member for imparting a predetermined time delay to the output signal therefrom; first polarity selecting means connected to the output of said time delay means for passing only signal components having a predetermined first polarity; second polarity selecting means connected to the output of said time delay means for passing only signal components having the polarity opposite to the predetermined first polarity; a second amplitude modulator connected between said power generator associated with the controlled resonator and said first polarity selecting means for controlling the power supplied to the controlled resonator by an amount proportional to the instantaneous value of each signal component passed by said first polarity selecting means; and a controllable attenuation member coupled between the controlled resonator and said second polarity selecting means to attenuate the power delivered to the controlled resonator by an amount proportional to the instantaneous value of each signal component passed by said second polarity selecting means.

19. An arrangement as defined in claim 10 wherein said controllable member comprises a transistor connected to be controlled by the signal provided by said second polarity selecting means.

20. An arrangement as defined in claim 10 wherein said controllable member comprises a switching diode connected to be controlled by the signal provided by said second polarity selecting means.

* * * * *